United States Patent [19]

Wittke

[11] 4,100,508
[45] Jul. 11, 1978

[54] SEMICONDUCTOR LASER HAVING FUNDAMENTAL LATERAL MODE SELECTIVITY

[75] Inventor: James Pleister Wittke, Princeton, N.J.

[73] Assignee: RCA Corporation, New York, N.Y.

[21] Appl. No.: 770,512

[22] Filed: Feb. 22, 1977

[51] Int. Cl.$^2$ .............................................. H01S 3/19
[52] U.S. Cl. ................................. 331/94.5 H; 357/18
[58] Field of Search ..................... 331/94.5 H, 94.5 C; 357/18

[56] References Cited

U.S. PATENT DOCUMENTS

| | | | |
|---|---|---|---|
| 3,701,047 | 10/1972 | Caplan et al. ................ | 331/94.5 H |
| 3,849,738 | 11/1974 | Hakki ............................. | 331/94.5 H |
| 3,866,238 | 2/1975 | Monroe ........................ | 331/94.5 H X |
| 4,001,719 | 1/1977 | Krupka ......................... | 331/94.5 H |

Primary Examiner—Stanley D. Miller, Jr.
Assistant Examiner—James W. Davie
Attorney, Agent, or Firm—H. Christoffersen; B. E. Morris; D. S. Cohen

[57] ABSTRACT

A semiconductor laser having opposed end surfaces with an optical reflective means on the surface of at least one end surface has fundamental lateral mode selectivity. The laser has an optical waveguide that extends from one end surface to the other. The optical reflective means may be an electrical insulation layer on the end surface with a reflective stripe on the insulation layer and having a width in the lateral direction less than that of the spatial width of the fundamental lateral mode in the absence of the reflective stripe. Alternatively, the selectivity means can be an antireflection layer on the end surface with a stripe opening in the antireflection layer having a width in the lateral direction less than that of the spatial width of the fundamental lateral mode in the absence of the antireflection layer. The opening in the antireflection layer is formed by placing a wire close to the end surface and evaporating the antireflection material onto the end surface. The wire prevents the material from being deposited onto the end surface under the wire thereby forming the opening. Both the reflection stripe and stripe opening are positioned on that portion of the optical waveguide at the end surface having substantially the highest optical radiation intensity.

6 Claims, 3 Drawing Figures

SEMICONDUCTOR LASER HAVING FUNDAMENTAL LATERAL MODE SELECTIVITY

BACKGROUND OF THE INVENTION

The present invention relates to semiconductor lasers, and more specifically to semiconductor lasers having fundamental lateral mode selectivity.

It is a well known fact that the optical radiation emitted from a semiconductor laser consists of radiation having a finite number of transverse modes and lateral modes. The fundamental mode in either the transverse or lateral direction is the mode of optical radiation having no nodes; all other modes in the lateral or transverse direction are known as higher order modes. The prior art has taught that if the active region or recombination region of the semiconductor laser is made thin enough the number of transverse modes could be reduced to only the fundamental transverse mode.

Limiting the radiation in the emitted optical radiation beam to the fundamental mode alone in the lateral direction has proved to be a difficult undertaking. Attempts have been made to achieve single lateral mode operation of lasers by confining the optical gain region to a long, narrow stripe across the body and perpendicular to the cleaved mirrored end surfaces by using narrow stripe electrical contacts near the recombination region. This generally does not provide enough mode selectivity to assure single mode operation, especially at high drive current levels.

The operation of a semiconductor laser in the fundamental lateral and fundamental transverse modes alone is most desirable since the emitted optical radiation beam will be much narrower than radiation containing a finite number of lateral and transverse modes. Single mode laser operation is especially desirable in such applications as fiber optical communications and video disc readout. Therefore, it would be most desirable to be able to operate a semiconductor laser not only in the fundamental transverse mode but also in the fundamental lateral mode.

SUMMARY OF THE INVENTION

A semiconductor laser which is capable of fundamental lateral mode selectivity includes a rectangular parallelepiped body of semiconductor material having opposed end surfaces, opposed side surfaces extending to the end surfaces, opposed first and second contact surfaces extending to the end surfaces and the side surfaces. The semiconductor laser has therein an optical waveguide which substantially confines the optical radiation capable of being generated in the laser. The optical waveguide extends from one end surface to the opposite end surface. A stripe contact is on the one contact surface. The stripe contact is spaced from the side surfaces and extends to the end surfaces. An opposite contact is on the opposite surface. The semiconductor laser further includes optical reflective means contiguous to the waveguide at the end surface for providing the fundamental lateral mode radiation with greater reflectivity than the higher order lateral mode radiation.

DETAILED DESCRIPTION OF THE INVENTION

Figure 1:
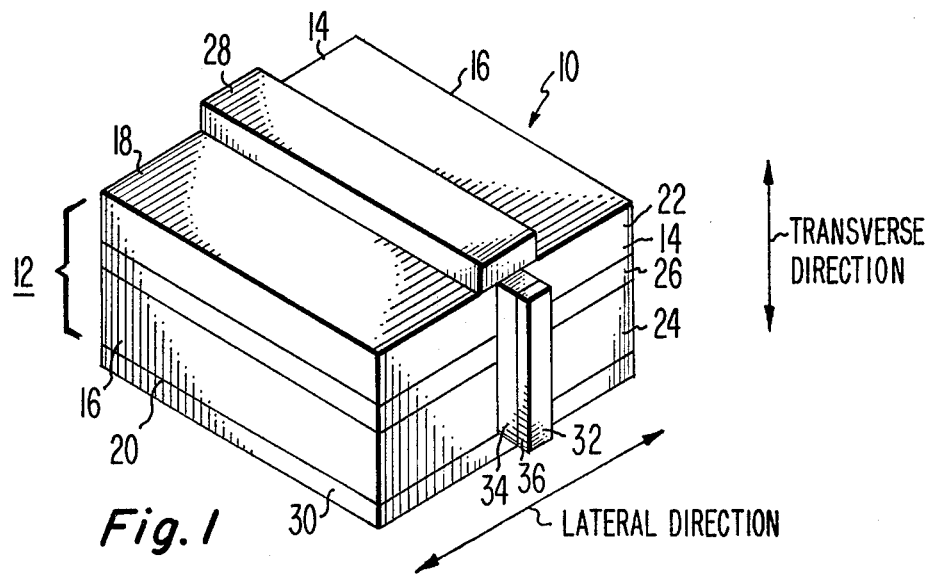
FIG. 1 is a perspective view of the semiconductor laser of the present invention having optical reflective means for providing fundamental lateral mode selectivity.

Referring to FIG. 1, the semiconductor laser having fundamental lateral mode selectivity is designated as 10. The semiconductor laser 10 includes a body 12 of semiconductor material capable of generating optical radiation when biased with a voltage. Typically, the body 12 is of semiconductor materials found in groups III and V of the Periodic Table of Elements. The body 12 is a rectangular parallelepiped having opposed end surfaces 14, opposed side surfaces 16 extending to the end surfaces 14 and opposed first and second contact surfaces 18 and 20 respectively. The first and second contact surfaces extend to the end surfaces 14 and side surfaces 16.

For the purpose of describing the lateral mode selectivity of the present invention, the semiconductor body 12 includes three contiguous semiconductor layers. However, the body 12 can have more or fewer layers than that which is described, as long as it is of a structure which will promote optical radiation lasing, as is known to those skilled in the art. The body 12 has therein a first layer 22 along the first contact surface 18, a second layer 24 along the second contact surface 20 and a third layer 26 contiguous to and between the first and second layers 22 and 24. The first and second layers 22 and 24 are of a semiconductor material having a lower index of refraction and higher bandgap energy than the semiconductor material of the third region 26. Thus, heterojunctions are formed between the third region 26 and each of the first and second regions 22 and 24. For example the first and second layers 22 and 24 could be of aluminum gallium arsenide (AlGaAs) while the third layer 26 is of gallium arsenide (GaAs). For the purpose of describing the present invention, it is assumed that the first and third layers 22 and 26 are of P type conductivity while the second layer 24 is of N type conductivity, although the three layers may be of conductivities opposite to that described.

The lateral direction along the body 12 is from side surface 16 to side surface 16. The transverse direction along the body 12 is between first and second contact surfaces 18 and 20.

A stripe contact 28 is on the first contact surface 18 extending from end surface 14 to end surface 14 and being spaced from the side surfaces 16. The stripe contact 28 is of a material providing good electrical contact to the first layer 22, e.g., a metal such as gold or chromium or a combination thereof. An opposite contact 30 is on the second contact surface 20 and is of a material providing good electrical contact to the second layer 24, e.g., a metal such as gold or chromium or a combination thereof.

Optical reflective means 32 is provided at end surfaces 14 for enhancing the reflection of the fundamental lateral mode at the end surface 14 more than that of the other higher order lateral modes incident at the end surfaces 14. While the optical reflective means 32 is described at both end surfaces 14, reflective means 32 can be on only one end surface 14 with the reflectivity of the other end surface 14 being uniform over the surface area as found in conventional lasers. The optical reflective means 32 can be a first layer of electrical insulation material 34 contiguous to the end surface 14, with an optical reflection stripe 36 on the insulation layer 34 and spaced from the end surfaces 14. The insulation layer 34 may be of a material such as silicon dioxide. The optical reflection stripe 36 is typically of a metal having high optical reflectivity such as aluminum. With the described configuration of the means 32, the insulation layer 34 is useful between the end surfaces 14 and the optical reflection stripe 36 so as to prevent electrical shorting of the semiconductor layer 10. The optical reflection stripe 36 typically should extend in the transverse direction a distance at least equal to the distance between the transverse boundaries of the optical waveguide formed in the body 12 (subsequently to be discussed in more detail). More specifically, the reflection stripe 36 should extend over that transverse distance wherein essentially all the optical energy of the fundamental transverse mode is contained. However, the optical reflection stripe 36 is shown in FIG. 1 extending beyond the transverse boundaries of the optical waveguide.

In a laser as described above, in the absence of the optical reflection stripe 36, the width of the fundamental lateral mode is basically determined by the width in the lateral direction of the optical waveguide which in turn is approximately that of stripe contact 28. This is well known to those skilled in the laser art.

The width of the reflection stripe 36 in the lateral direction is less than the spatial width of the fundamental lateral mode of optical radiation generated within the body 12 and incident onto the end surface 14 in the absence of the reflection stripe 36. An effect of the optical reflection stripe 36 is to alter the mode pattern of the laser 10, making the width of the fundamental lateral mode now equal to approximately the width of the reflection stripe 36, i.e., the width of the fundamental lateral mode radiation as a result of the reflection stripe 36 is reduced. There are two effects associated with the addition of the optical reflection stripe 36; (1) the threshold current for oscillation of the laser 10 will be altered, and (2) the relative losses of the fundamental and higher order lateral modes will be altered so as to increase the ratio of the threshold current for any higher order mode to the threshold current of the fundamental lateral mode. The second effect results in the desired fundamental lateral mode selectivity of the laser 10. For optimum effect the optical reflection stripe 36 is spaced from and covers that portion of the optical waveguide at the end surfaces 14 having the highest optical radiation intensity. As is well known in the laser art, the optical radiation intensity distribution across the optical waveguide in the lateral direction will be to the first order Gaussian, with the highest optical radiation intensity in the center region of the optical waveguide. These requirements with respect to reflection stripe 36 will be better understood from the subsequent discussion of the operation of the semiconductor laser 10.

Typically, the insulation layer 34 will have approximately the same dimensions as the optical reflection stripe 36. However, this need not be necessary as long as the insulation layer 34 electrically insulates the optical reflection stripe 36 from the body 12.

In the operation of the semiconductor laser 10, a forward bias voltage is applied to the body 12 by connecting the stripe contact 28 and contact 30 to a voltage source (not shown). As a result of the applied forward bias voltage, charged carriers, e.g., electrons, are injected into the third region 26 from the second region 24. The charged carriers recombine in the third region 26 with majority carriers (e.g., holes) to generate optical radiation, which is in the form of electromagnetic waves. As previously described, the first and second layers 22 and 24 are of a lower index of refraction than the third region 26. Total internal reflection of optical radiation results from radiation traveling in a higher index of refraction medium striking, at a low angle, an interface with a medium of lower refractive index. Consequently, the radiation generated within the third region 26 is substantially confined in a transverse direction between the heterojunctions formed between the third layer 26 and each of the first and second layers 22 and 24.

Furthermore, when the laser 10 is forward biased, current flows from the stripe contact 28 to the opposite contact 30. As the current flows from the stripe contact 28, which is narrow in width, to the opposite contact 30, which is broader in width, there is a flaring out of the current along its path. This effect is obvious to those skilled in the art. However, that portion of the body 12 through which the majority of the current flows, has a higher index of refraction than the remaining portion of the body 12, due to the increase in carrier density and as a result of the heating effect of the current flow. Thus, this difference in index of refraction due to the localization of the current forms an optical waveguide in conjunction with the transverse boundaries formed by the heterojunctions at the third region 26. Summarizing, an optical waveguide and a high optical gain region, with respect to the electromagnetic optical radiation generated within the third region 26, is formed by the heterojunctions with respect to the transverse direction and by the current flow with respect to the lateral direction. That portion of body 12 which is bound by the optical waveguide includes therein what those skilled in the art refer to as the active or recombination region of the laser 10, i.e., the region wherein minority and majority carriers recombine resulting in the generation of optical radiation. The optical waveguide substantially confines the optical radiation generated therein.

Radiation generated within the third region 26 will travel along the optical waveguide in the general direction of the end surfaces 14. While traveling along the waveguide the electromagnetic optical radiation will grow in intensity as a result of stimulated emission. It is also well known to those skilled in the art that this electromagnetic optical radiation traveling along the waveguide in the body 12 will include a finite number of modes in both the transverse and lateral directions. A mode is an electromagnetic field pattern in the laser that matches the boundary conditions of the waveguide structure. A mode can also be defined as an electromagnetic field pattern that can propagate through a waveguide without changing its field pattern.

With respect to the transverse mode, it is well known to those skilled in the art that the transverse modes can be reduced to only the fundamental transverse mode by making the waveguide in the transverse direction very thin, i.e., making the third layer 26 very thin. However, the laser 10 of the present invention relates to fundamental lateral mode selectivity. The lasing action of the generated electromagnetic optical radiation is the result of the radiation being reflected back and forth in the optical waveguide between the end surfaces 14. With each passage through the optical waveguide, the intensity of the radiation is amplified until it eventually lases. There are a finite number of lateral modes represented in the generated electromagnetic optical radiation as it propagates towards the end surfaces 14. If the fundamental lateral mode is provided with more reflection at the end surface 14 than the radiation of the other lateral modes, substantially all the radiation that is amplified is in the fundamental lateral mode. This further means, as previously stated, that the current threshold density required for lasing in the lateral direction is much lower for the fundamental lateral mode than for the other higher order lateral modes. The enhanced reflection of the fundamental lateral mode is provided at the end surfaces 14 by the optical reflection stripe 36. The lateral modes other than the fundamental lateral mode will suffer much larger diffraction losses at the end surfaces 14, since they do not have the benefit of the enhanced reflectivity provided by reflection stripe 36 and are thus preferentially suppressed. Thus, the enhanced reflectivity for the fundamental lateral mode ensures the amplification and eventual lasing of electromagnetic optical radiation in the fundamental lateral mode, and the suppression of electromagnetic radiation in the remaining lateral modes.

If the laser 10 of the present invention is approximately 0.010 inch long and has a stripe contact 28 of lateral width 20 μm, the optical reflection stripe 36 should be about 5 μm in lateral width. This width is less than the width of the fundamental lateral mode in the absence of the optical reflection stripe 36. There is a compromise in determining the spatial width of the optical reflection stripe 36. The narrower the width of the reflection stripe 36, the better the laser 10 fundamental lateral mode selectivity. However, if the reflection stripe 36 is too narrow, the threshold current of the fundamental lateral mode will rise to an undesirable level. Thus, it is obvious to those skilled in the laser art that these two effects must be considered in determining the optimal lateral width of the reflection stripe 36. It has been found that for laser 10 as described, the optical reflection stripe 36 can be as wide as 10 to 15 μm in the lateral direction; however, there is then a somewhat reduced, but still significant effect on mode selectivity. Comparable results are obtained on both longer, i.e., greater than 0.010 inch, and shorter lasers.

Assuming the third region 26 is of GaAs, the reflectivity of that portion of the waveguide at end surfaces 14, not covered by reflective means 32, is about 32%, since GaAs has an index of refraction of 3.6 and air has an index of refraction of 1.0. The reflectivity of a material is given approximately by the Fresnel formula:

$$R = (n-1/n+1)^2$$

wherein "R" is the reflectivity and "n" is the index of refraction of the material. For optimum fundamental lateral mode selectivity, the reflectivity of the optical reflection stripe 36 should be higher than the reflectivity of the end surfaces 14 not covered by reflection stripe 36, with the reflectivity of the reflection stripe 36 as high as possible.

In the fabrication of the semiconductor laser 10, the body 12 can be formed by conventional liquid phase or vapor phase epitaxial techniques, and the stripe contact 28 and opposite contact 30 can be formed by conventional masking and evaporation techniques. As for the electrical insulation layer 34 and optical reflection stripe 36, they may be formed by first forming the insulating layer 34 on the end surfaces 14 by conventional evaporation and masking techniques and then by forming the reflection stripe 36 on the insulating layer 34 again by the use of conventional evaporation and masking techniques.

Figure 2:
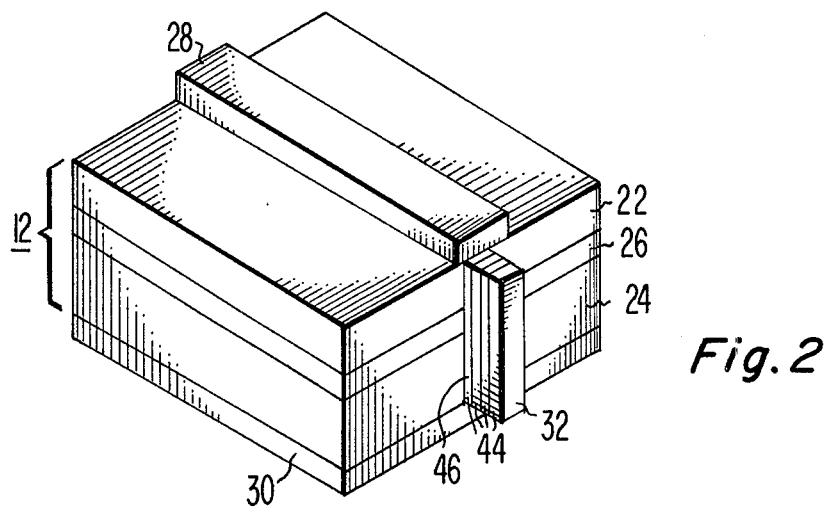
FIG. 2 is a perspective view of the semiconductor laser of the present invention having an alternative optical reflective means.

Referring to FIG. 2, an alternative optical reflective means 32 is shown. The body 12, stripe contact 28 and opposite contact 30 are the same as shown in FIG. 1. The alternative fundamental optical reflective means 32 includes a plurality of contiguous stripe layers 44 of alternatively low and high index of refraction dielectric materials, such as silicon dioxide and zinc sulfide respectively. A first stripe layer 46, usually of low index of refraction, is on the end surfaces 14 at that portion of the optical waveguide having the highest optical radiation intensity. The other stripe layers 44 are sequentially spaced from the end surfaces 14. Each layer is of one-quarter optical wavelength in thickness. The plurality of stripe layers 44 in essence forms a high reflectivity dielectric mirror, which provides the mode selectivity of laser 10. The width of the stripe layers 44 in the transverse and lateral directions is the same as described with respect to the optical reflection stripe 36 of FIG. 1. The stripe layers 44 are fabricated by conventional masking and evaporation techniques.

Figure 3:
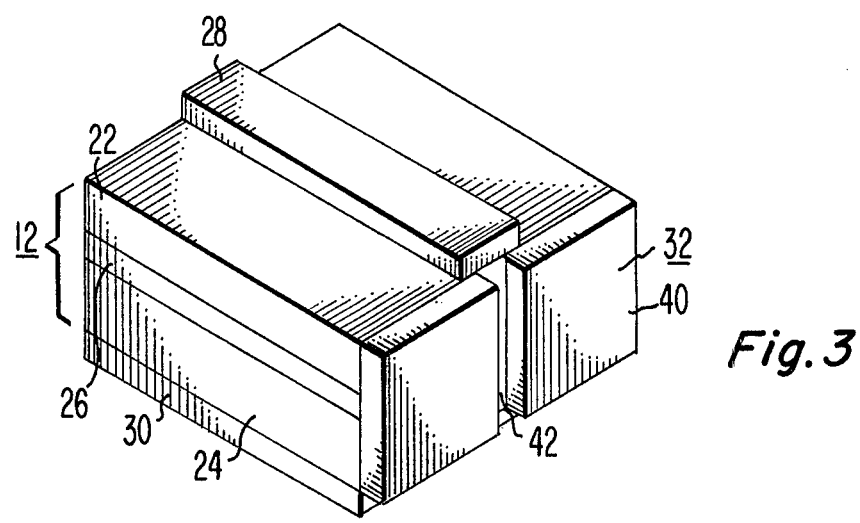
FIG. 3 is a perspective view of the semiconductor laser of the present invention having a preferred alternative optical reflective means.

Referring to FIG. 3, a preferred alternative optical reflective means 32 is shown. The body 12, stripe contact 28 and opposite contact 30 are the same as shown in FIG. 1. The alternative optical reflective means 32 includes an antireflection layer 40, having an opening 42 therein. The antireflection layer 40 is of a material such as aluminum oxide. The opening 42 in the antireflection layer 40 has the same dimension requirements with respect to lateral width and transverse width as did the optical reflection stripe 36. Typically, the opening 42 is in the form of a stripe. The opening 42 is contiguous to that portion of the waveguide at the end surfaces 14 having the highest optical radiation intensity.

Electromagnetic optical radiation which is generated within and confined to the optical waveguide of the semiconductor laser 10, and is incident on the end surfaces 14 covered by the antireflection layer 40, will not be reflected back into the body 12. If the antireflection layer 40 is optically perfect, the reflectivity at the end surfaces 14 covered by the antireflection layer 40 is zero. However, at the end surfaces 14 where there is the opening 42, there is a difference in index of refraction between the semiconductor material of the body 12 and the air. The air has an index of refraction of one while the semiconductor material of the optical waveguide is, for example, gallium arsenide having an index of refraction of 3.6. Thus, by using well known reflectivity formulas, one can calculate that at the opening 42 the reflectivity is approximately 32%. Therefore, like the first optical reflection means 32, this preferred approach reduces the spatial width of the fundamental lateral mode radiation and enhances the reflectivity of the fundamental lateral mode radiation relative to the higher order radiation. If the antireflection layer 40 does provide zero reflectivity and there is 32% reflectivity at the opening 42, it has been found that the threshold current density for the fundamental lateral mode is approximately 50% less than for the other higher order lateral modes, for lasers of the typical dimensions given above.

Additional insulating layers, such as may be conventionally applied to the end surfaces 14 to protect them from atmospheric attack, can be used on the antireflection layer 40 and in the opening 42 as long as these insulating layers do not alter the desired preferential reflectivity pattern used to obtain the desired mode selectivity.

The antireflection layer 40 can be fabricated by evaporating in a vacuum a dielectric material of suitable thickness and index of refraction on the end surfaces 14. The antireflection layer 40 is typically one-quarter optical wavelength in thickness and has an index of refraction equal to the square root of the index of the semiconductor material of the optical waveguide, i.e., the third region 26. For a third layer 26 of gallium arsenide, the antireflection layer 40 can be aluminum oxide that is approximately 1200 angstroms in thickness. To form the opening 42, a fine wire can be placed close to the end surfaces 14 such that it covers that portion of the waveguide having the highest radiation intensity. During evaporation of the antireflection layer 40, the wire will prevent the dielectric material from forming on a portion of the end surfaces 14 thereby forming the opening 42. The diameter of the wire should approximately equal the width desired of the opening 42.

It is also anticipated by the present invention, although not shown in the FIGURES, that the alternative optical reflective means 32 as shown in FIGS. 1, 2 and 3, can be combined together. That is to say, the reflection stripe 36 or stripe layers 44 could occupy the opening 42 in the antireflection layer 40 of the preferred alternative reflective means 32 as shown in FIG. 3.

While the reflection stripe 36 and opening 42 have been shown to extend between the contact surfaces 18 and 20, it is obvious from the proceeding description of the present invention that they need only cover, in the transverse direction, the transverse boundaries of the optical waveguide at the end surfaces 14.

The semiconductor layer 10 of the present invention provides electromagnetic optical radiation emission of the fundamental mode in the lateral direction.

I claim:

1. A semiconductor laser capable of fundamental lateral mode selectivity having an optical waveguide which substantially confines optical radiation capable of being generated therein, which comprises:
   a rectangular parallelepiped body of semiconductor material having opposed end surfaces, opposed side surfaces extending to said end surfaces, and opposed first and second contact surfaces extending to said end surfaces and said side surfaces, said optical waveguide extending from one end surface to the opposite end surface;
   a stripe contact on said first contact surface, said stripe contact being spaced from said side surfaces and extending to said end surfaces, said stripe contact defining the lateral width of said optical waveguide;
   an opposite contact on said second contact surface; and
   optical reflective means contiguous to the waveguide at the end surfaces, said optical reflective means at at least one of said end surfaces being only within the lateral width of the optical waveguide and having a width in the lateral direction less than the spatial width of the fundamental lateral mode radiation in the absence of the reflective means so as to provide the fundamental lateral mode radiation with greater reflectivity than the higher order lateral mode radiations.

2. The semiconductor laser in accordance with claim 1 wherein said reflective means comprises an antireflection layer on said end surfaces with a stripe opening in said antireflection layer, said stripe opening having a width in the lateral direction less than the spatial width of the fundamental lateral mode radiation in the absence of the antireflection layer.

3. The semiconductor laser in accordance with claim 1 wherein said optical reflective means comprises an electrical insulation layer on said end surfaces, and an optical reflection stripe on said insulation layer, said reflection stripe having a width in the lateral direction less than the spatial width of the fundamental lateral mode radiation in the absence of the reflection stripe.

4. The semiconductor laser in accordance with claim 1 wherein said reflective means comprises a plurality of contiguous stripe layers of alternatively low and high index of refraction, a first stripe layer being contiguous to a portion of said optical waveguide at the end surface, with the other stripe layers sequentially spaced from said end surface, each of said stripe layers being one-quarter optical wavelength in thickness, and each stripe layer having a width in the lateral direction less than the spatial width of the fundamental lateral mode radiation in the absence of the stripe layers.

5. The semiconductor laser in accordance with claim 4 wherein the contiguous stripe layers are of dielectric material.

6. The semiconductor laser in accordance with claim 1 wherein said reflective means are on both of said end surfaces.

* * * * *